United States Patent
Fang et al.

(10) Patent No.: US 9,917,166 B2
(45) Date of Patent: *Mar. 13, 2018

(54) MEMORY FIRST PROCESS FLOW AND DEVICE

(71) Applicant: Cypress Semiconductor Corporation, San Jose, CA (US)

(72) Inventors: Shenqing Fang, Sunnyvale, CA (US); Chun Chen, San Jose, CA (US); Unsoon Kim, San Jose, CA (US); Mark Ramsbey, Sunnyvale, CA (US); Kuo Tung Chang, Saratoga, CA (US); Sameer Haddad, San Jose, CA (US); James Pak, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/181,138

(22) Filed: Jun. 13, 2016

(65) Prior Publication Data
US 2016/0293720 A1    Oct. 6, 2016

Related U.S. Application Data

(63) Continuation of application No. 13/715,577, filed on Dec. 14, 2012, now Pat. No. 9,368,606.

(51) Int. Cl.
*H01L 29/792* (2006.01)
*H01L 27/11573* (2017.01)
(Continued)

(52) U.S. Cl.
CPC .. *H01L 29/42344* (2013.01); *H01L 27/11568* (2013.01); *H01L 27/11573* (2013.01);
(Continued)

(58) Field of Classification Search
USPC .......... 257/29, 324, 314–316, 365, 311, 303
See application file for complete search history.

(56) References Cited

U.S. PATENT DOCUMENTS 5,824,584 A    10/1998 Chen et al.
5,969,383 A    10/1999 Chang et al.
(Continued)

FOREIGN PATENT DOCUMENTS

JP    2007318104 A    12/2007
JP    2008041832 A    2/2008
(Continued)

OTHER PUBLICATIONS

Yanagi, I., et al., "Quantum confinement effect of efficient hole injection in MONOS-type nonvolatile memory—the role of ultrathin i-Si/P+ poly-Si stacked gate structure fabricated by laser spike annealing," 146-147, Symposium on VSLI Technology, Digest of Technical Papers, Central Research Laboratory, Hitachi Ltd., 2007.

(Continued)

*Primary Examiner* — Moin Rahman

(57) ABSTRACT

A semiconductor device includes a substrate comprising a source region and a drain region, a bit storing element formed on the substrate, a memory gate structure, a first insulating layer formed on the substrate, a second insulating layer formed on the substrate, and a select gate structure formed on the first insulating layer. The second insulating layer is formed on the memory gate structure and the select gate structure and between the memory gate structure and the select gate structure.

14 Claims, 26 Drawing Sheets

(51) Int. Cl.
*H01L 29/423* (2006.01)
*H01L 29/66* (2006.01)
*H01L 27/11568* (2017.01)
*H01L 21/28* (2006.01)

(52) U.S. Cl.
CPC ...... *H01L 29/66833* (2013.01); *H01L 29/792* (2013.01); *H01L 21/28282* (2013.01)

(56) References Cited

U.S. PATENT DOCUMENTS

| | | | |
|---|---|---|---|
| 6,972,997 | B2 | 12/2005 | Ishimaru et al. |
| 7,057,230 | B2 | 6/2006 | Tanaka et al. |
| 7,115,943 | B2 | 10/2006 | Mine et al. |
| 7,235,441 | B2 | 6/2007 | Yasui et al. |
| 7,371,631 | B2 | 5/2008 | Sakai et al. |
| 7,414,283 | B2 | 8/2008 | Tanaka et al. |
| 7,504,689 | B2 | 3/2009 | Hisamoto et al. |
| 7,557,005 | B2 | 7/2009 | Ishii et al. |
| 7,663,176 | B2 | 2/2010 | Sakai et al. |
| 7,667,259 | B2 | 2/2010 | Yasui et al. |
| 7,700,992 | B2 | 4/2010 | Tanaka et al. |
| 7,723,779 | B2 | 5/2010 | Hisamoto et al. |
| 7,863,135 | B2 | 1/2011 | Sakai et al. |
| 7,863,670 | B2 | 1/2011 | Ishii et al. |
| 8,017,986 | B2 | 9/2011 | Tanaka et al. |
| 8,125,012 | B2 | 2/2012 | Mine et al. |
| 9,368,606 | B2 | 6/2016 | Fang et al. |
| 2005/0230736 | A1 | 10/2005 | Ishimaru et al. |
| 2007/0262382 | A1 | 11/2007 | Ishii et al. |
| 2008/0029805 | A1 | 2/2008 | Shimamoto et al. |
| 2008/0076221 | A1 | 3/2008 | Kang et al. |
| 2008/0188052 | A1 | 8/2008 | Winstead et al. |
| 2008/0265309 | A1 | 10/2008 | Higashi et al. |
| 2009/0273013 | A1 | 11/2009 | Winstead et al. |
| 2010/0029052 | A1 | 2/2010 | Kang et al. |
| 2010/0099246 | A1* | 4/2010 | Herrick .................. B82Y 10/00 438/591 |
| 2010/0112799 | A1* | 5/2010 | Jeong ................ H01L 21/28273 438/591 |
| 2010/0193856 | A1* | 8/2010 | Okuyama ......... H01L 21/28282 257/324 |
| 2010/0237467 | A1 | 9/2010 | Dalton et al. |
| 2011/0039385 | A1 | 2/2011 | Shimamoto et al. |
| 2011/0175158 | A1 | 7/2011 | Lee et al. |
| 2011/0211396 | A1 | 9/2011 | Takeuchi |
| 2012/0068243 | A1* | 3/2012 | Kawashima ...... H01L 27/11573 257/315 |
| 2013/0221308 | A1 | 8/2013 | Toh et al. |

FOREIGN PATENT DOCUMENTS

| | | |
|---|---|---|
| JP | 2009532911 A | 9/2009 |
| JP | 2011040782 A | 2/2011 |
| JP | 2011199084 A | 10/2011 |
| JP | 2011210969 A | 10/2011 |
| KR | 20110075952 A | 7/2011 |

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

Matsubara, K. et al., "Highly Reliable 10ns MONOS Flash," elmicro.com/files/renesas/monos_flash_ewc_2008_for_proceedings.pdf, Renesas Technology Europe GmbH, 2008.

Tanaka, T., et al., "Hitachi, A 512kB MONOS type Flash Memory Module Embedded in a Micro Controller," 211-212, Symposium on VLSI Circuits, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Labratories, NEC Corporation, 2008.

International Search Report for International Application No. PCT/US2013/074390 dated Mar. 26, 2014; 5 pages.

USPTO Advisory Action for U.S. Appl. No. 13/715,577 dated Jul. 28, 2014; 3 pages.

USPTO Advisory Action for U.S. Appl. No. 13/715,577 dated Sep. 10, 2015; 3 pages.

USPTO Final Rejection for U.S. Appl. No. 13/715,577 dated May 20, 2014; 12 pages.

USPTO Final Rejection for U.S. Appl. No. 13/715,577 dated Jul. 1, 2015; 18 pages.

USPTO Non-Final Rejection for U.S. Appl. No. 13/715,577 dated Apr. 22, 2015; 16 pages.

USPTO Non-Final Rejection for U.S. Appl. No. 13/715,577 dated Nov. 15, 2013; 10 pages.

USPTO Non-Final Rejection for U.S. Appl. No. 13/715,577 dated Nov. 19, 2015; 18 pages.

USPTO Notice of Allowance for U.S. Appl. No. 13/715,577 dated Feb. 10, 2016; 8 pages.

Written Opinion of the International Searching Authority for International Application No. PCT/US2013/074390 dated Mar. 26, 2014; 5 pages.

USPTO Restriction Requirement for U.S. Appl. No. 15/281,010 dated Jul. 27, 2017; 11 pages.

SIPO Office Action for Application No. 2015547497 dated Mar. 6, 2017; 3 pages.

SIPO Office Action for Application No. 2015547497 dated Jun. 14, 2017; 3 pages.

USPTO Examiner-Initiated Interview Summary for U.S. Appl. No. 15/281,010 dated Oct. 25, 2017; 1 page.

USPTO Notice of Allowance for U.S. Appl. No. 15/281,010 dated Oct. 25, 2017; 16 pages.

* cited by examiner

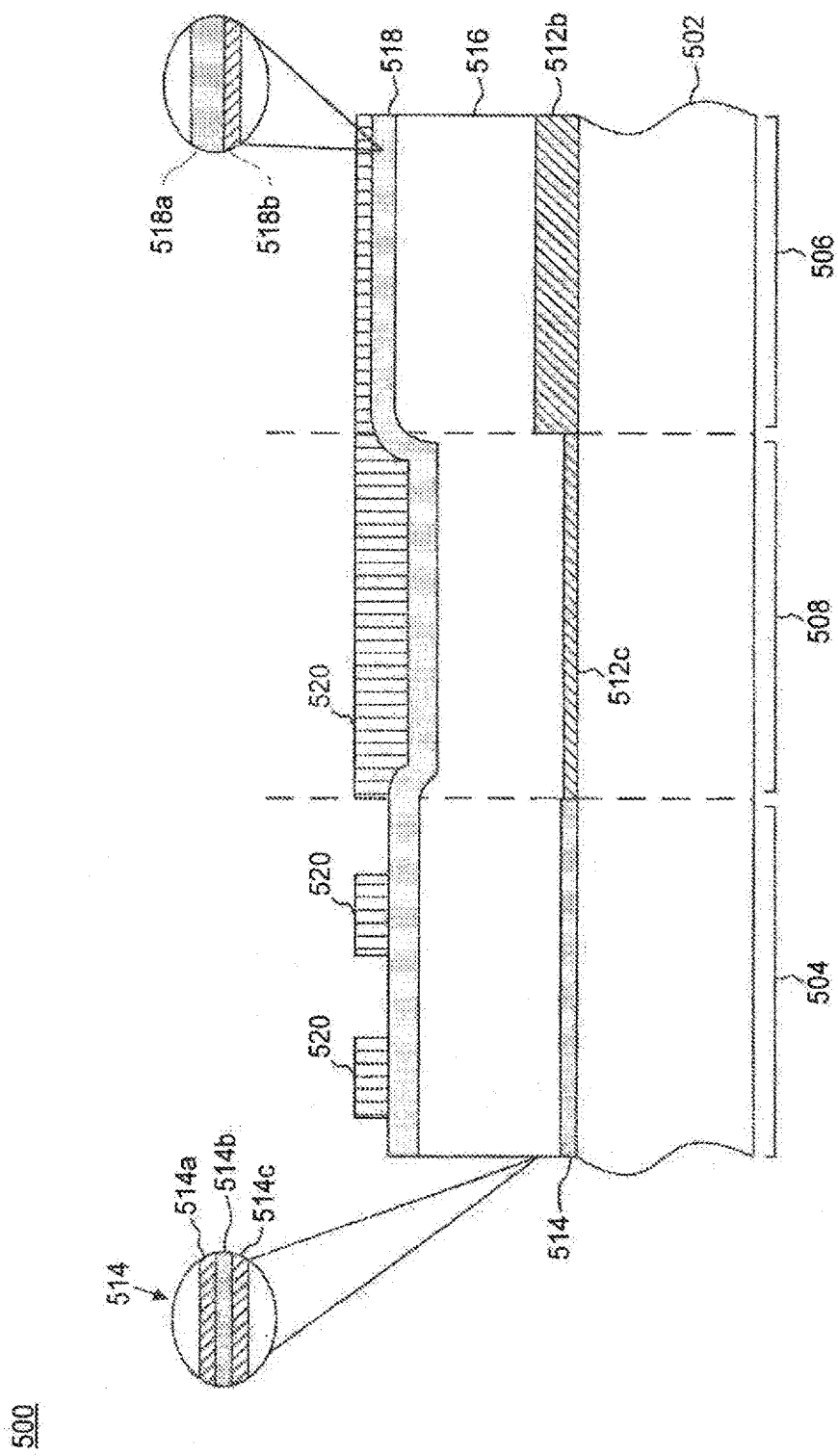

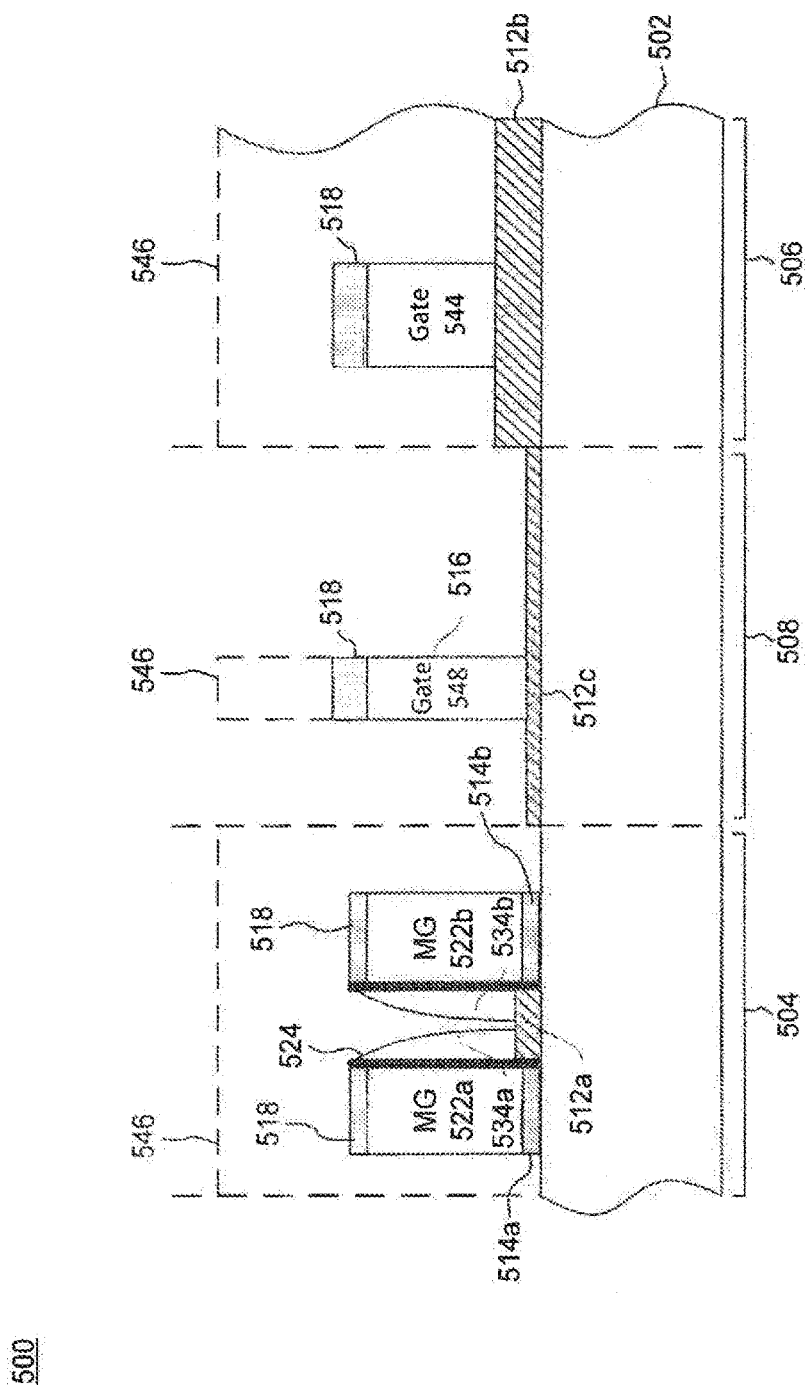

MEMORY FIRST PROCESS FLOW AND DEVICE

CROSS-REFERENCE TO RELATED APPLICATION

This application is a continuation of U.S. patent application Ser. No. 13/715,577 filed Dec. 14, 2012, which is incorporated herein in its entirety.

BACKGROUND

Technical Field

This disclosure relates generally to improve embedded semiconductor device and methods and apparatus for making such semiconductor device.

Related Art

An embedded semiconductor device such as a Flash memory may include, among other things, a memory core and a number of logic gates to control operations that act upon the memory core (e.g., read, write, and erase operations). Combining the memory core and the logic gates of a Flash memory into a single integrated circuit (IC) has historically required relatively expensive, time consuming, and difficult manufacturing processes.

Accordingly, there is a need for devices and methods of producing the devices that facilitate less expensive and faster manufacturing of semiconductor devices, such as, but not limited to, Flash memory, that comprise components that are generally subject to different manufacturing process steps.

BRIEF SUMMARY OF THE INVENTION

A semiconductor device is provided. According to embodiments, the semiconductor device includes a memory gate disposed in a first region of the semiconductor device. The memory gate may include a first polycrystalline silicon ("poly") layer disposed over a charge trapping dielectric. A select gate may be disposed in the first region of the semiconductor device adjacent to a sidewall of the memory gate. A sidewall dielectric may be disposed between the sidewall of the memory gate and the select gate. Additionally, the device may include a logic gate disposed in a second region of the semiconductor device that comprises the first poly layer.

A method of manufacturing a semiconductor device having a first region and a second region is provided. According to the method, the second region is masked and a layer of poly is disposed above a charge trapping dielectric in the first region. The poly layer can be etched to form a memory gate. A sidewall dielectric can be disposed on a sidewall of the memory gate and a second layer of poly can be formed. The second layer of poly can then be etched to form a select gate adjacent to the side wall of the memory gate. The first region can then be masked and a logic gate can be formed in the second region of the semiconductor device.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIGS. 5A-5I depict a cross-section of a memory device at various points during its manufacture according to various embodiments.

Figure 1:
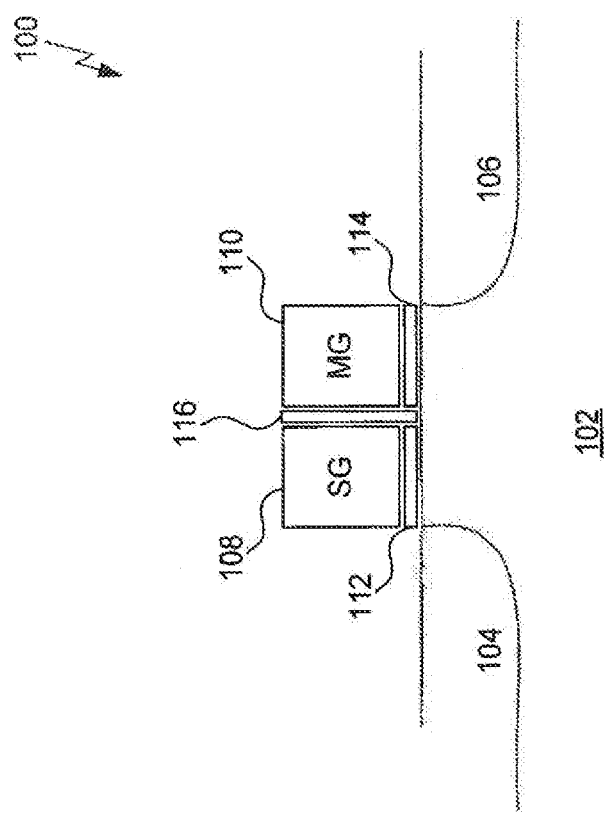
FIG. 1 depicts a cross-section of a split-gate memory cell according to various embodiments.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates an example of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped poly layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a charge trapping silicon nitride layer sandwiched between two silicon dioxide layers to create a three-layer stack collectively and commonly referred to as "ONO." Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. After the gates have been defined, regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and 3 volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
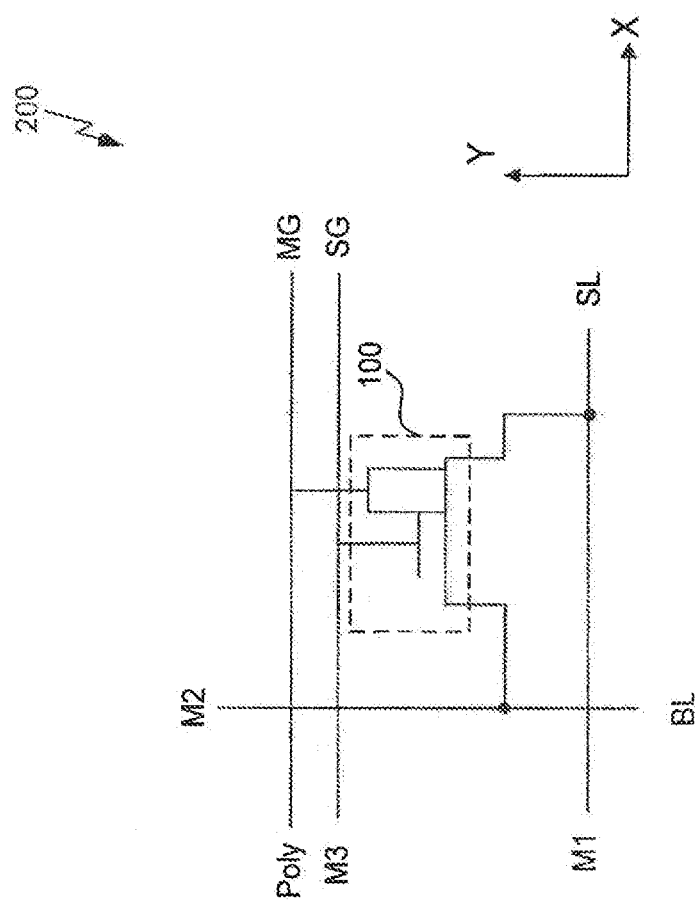
FIG. 2 is a circuit diagram of a memory cell in a memory array according to various embodiments.

FIG. 2 illustrates an example circuit diagram 200 that comprises a memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
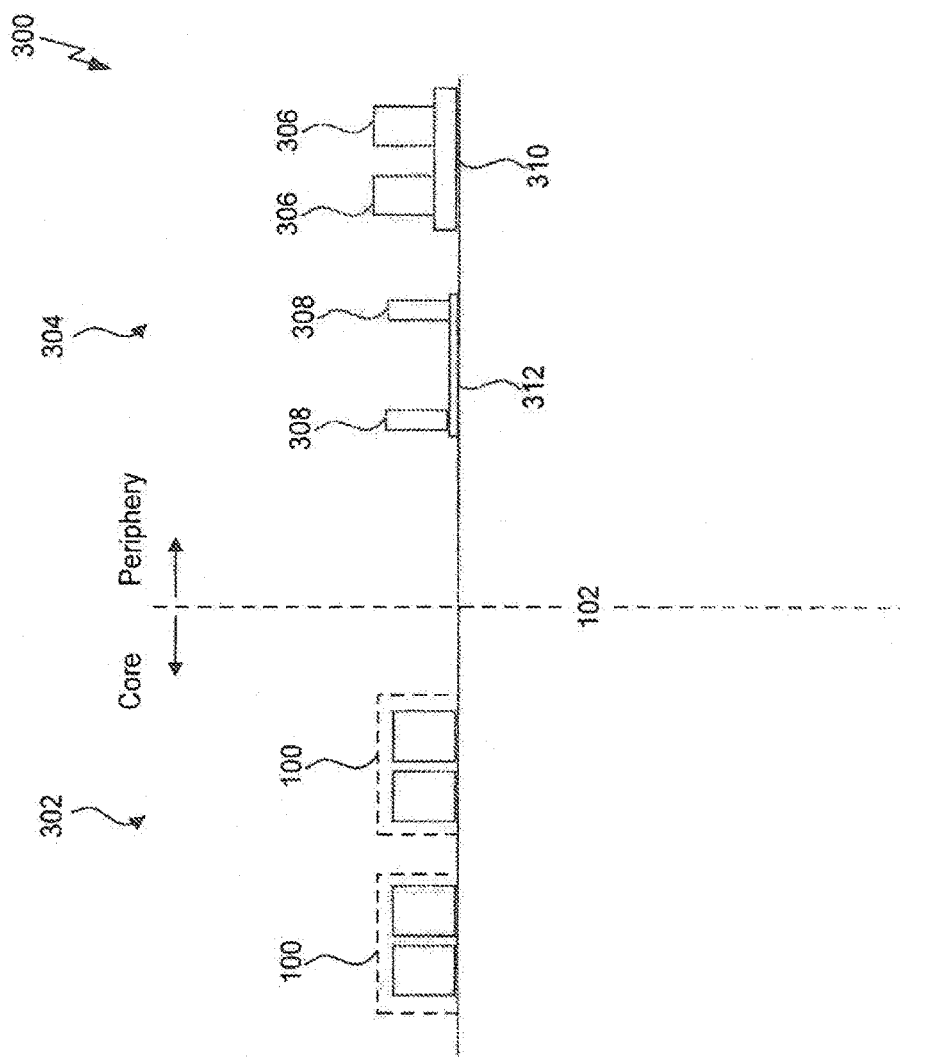
FIG. 3 depicts a cross-section of a semiconductor device according to various embodiments.

FIG. 3 illustrates an example semiconductor device 300 that includes both memory circuitry 302 and peripheral circuitry 304 in the same substrate 102. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Substrate 302—and indeed substrates in general as used throughout the description—can be silicon according to various embodiments. However, the substrate 302 may also be any of a wide array of semiconductor materials such as germanium, gallium arsenide, indium phosphide, etc. In other embodiments, the substrate 302 may be electrically non-conductive such as a glass or sapphire wafer.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308. As shown in FIG. 3, low voltage transistors 308 have a narrower width than high-voltage transistors 306, but this need not be the case. According to some embodiments, low-voltage 308 transistors can be wider than high voltage transistors 306 or, alternatively, low-voltage transistors 308 and high-voltage transistors 306 can have the same width.

During the descriptions herein, various regions of the substrate upon which the field-effect devices are fabricated are mentioned. For instance, with respect to FIG. 3, core region 302 and periphery region 304 were described. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

Figure 4:
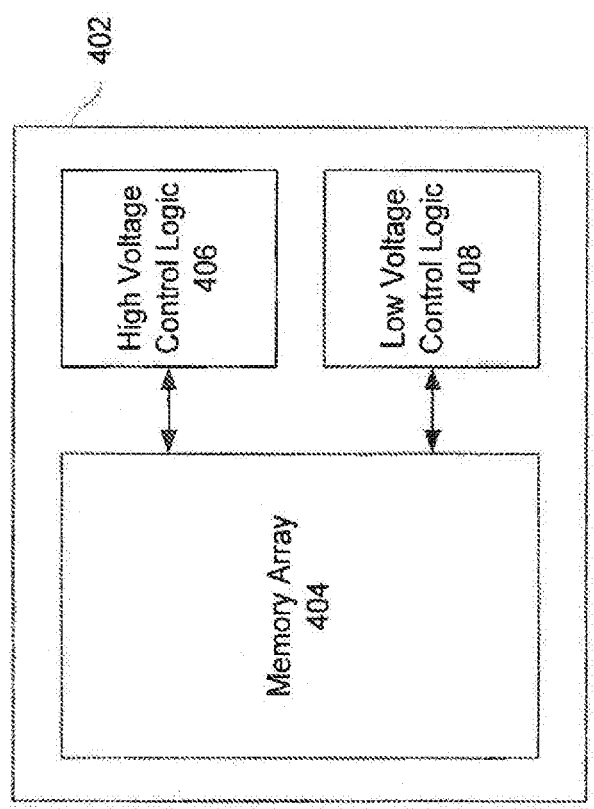
FIG. 4 is a functional block diagram of a memory device according to various embodiments.

FIG. 4 is a functional block diagram of a memory device 402 according to embodiments of the present invention. As shown, memory device 402 includes a memory array 404, high voltage control logic 406, and low voltage control logic 408. According to various embodiments, the memory array 404 may comprise a number of memory cells 100 and may be physically located in a core region 302 of memory device 402. High voltage control logic 406 may comprise a number of high-voltage transistors 306, which can be used to control and/or drive portions of the memory array 404. Additionally, the high voltage control logic 406 may be physically located in the periphery 304 of the memory device 402. Similarly to the high voltage control logic 406, the low voltage control logic 408 may comprise a number of low voltage transistors 308, which can be used to control and/or drive portions of the memory array 404. The low voltage control logic 408 may also be located in the periphery 304 of the memory device. According to various embodiments, the high voltage control logic 406 and the low voltage control logic 408 are located in different portions of the periphery region 304.

Figure 5B:
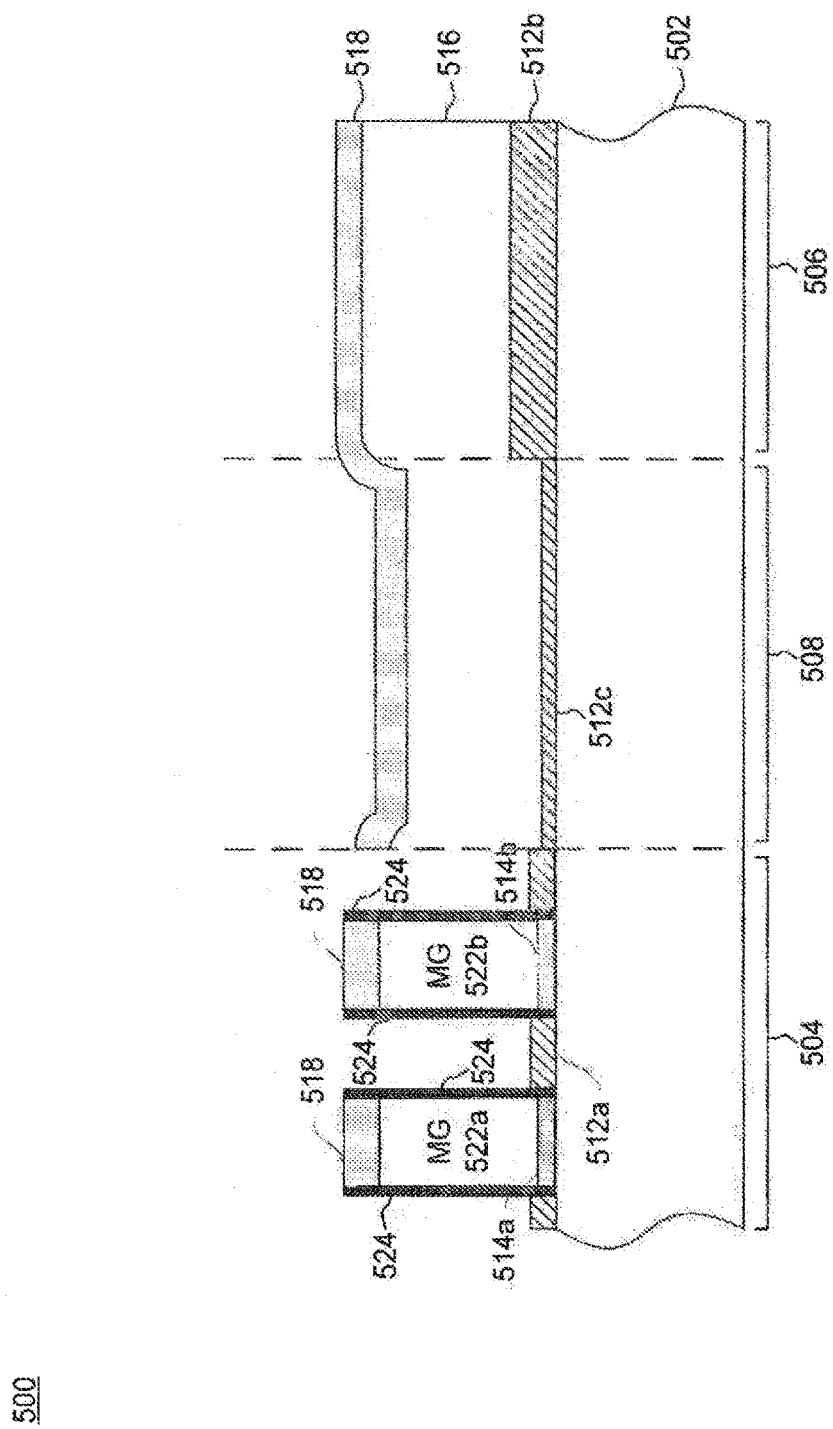

FIGS. 5A-5I depict a cross-section of a semiconductor device 500 at various points during its manufacture according to embodiments of the present invention. FIG. 5A depicts device 500 after the formation of a number of structures. As shown in FIG. 5A, the device 500 includes a substrate 502 which comprises three different regions 504, 506, and 508.

A first or memory region 504 of the substrate may be used for memory components. According to various embodiments, the first region 504 comprises a memory core region where a plurality memory cells (e.g., memory cell 100) can be formed. For instance, according to some embodiments, the first region may be used to form a number of split gate 108/memory gate 110 pairs.

Logic and/or control circuitry may be formed in periphery, which includes second and third regions 506 and 508, respectively according to various embodiments. The second region 506 may comprise the high voltage control logic region 406 and the third region 508 may comprise the low voltage control logic (e.g., region 408).

As shown in FIG. 5A, a gate oxide 512a is formed in first region 504 and gate oxide 512b is formed in second region 506. According to various embodiments the gate oxides 512a and 512b may be different thicknesses, but this need not be the case. The gate oxides 512a and 512b may be formed through any well-known method. For instance, the oxides may be grown on the substrate 502 and comprise an oxide of the substrate material (e.g., silicon oxide). It is also possible, however, for the gate oxides 512a and 512b to be disposed on the substrate and comprise an oxide of a different material than the substrate. Additionally, oxides 512a and 512b may comprise the same or different material and may be formed at the same time or at different times according to various embodiments. A gate oxide 512c may be disposed in the third region 508 according to various embodiments as well. The gate oxide 512c may be thinner than either of the of the gate oxides 512a and 512b according to some embodiments, but it also may be the same thickness as either or both of gate oxides 512a and 512b.

A charge trapping dielectric 514 has been disposed above the gate oxide 512a in the first region 504, as shown in FIG. 5A. According to various embodiments, the charge trapping dielectric comprises one or more layers of dielectric such as ONO, as described above. For instance, the charge trapping dielectric 514 may comprise a first oxide layer 514a, a charge trapping layer 514b, and a second oxide layer 514c. Regardless of the specific composition of the charge trapping dielectric 514, it preferably contains at least one charge trapping layer 514b. The charge trapping layer may be formed of a nitride, silicon rich nitride, and may include multiple layers of different nitrides according to some embodiments.

A poly layer 516 has been formed over all three regions 504, 506, and 508 of the device 500. According to various embodiments, the poly layer 512 may be disposed or deposited according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

Mask 518 has been formed over the second region 506 and the third region 508 of device 500. Additionally, the first region 504 has been patterned by pattern mask 520. Both mask 518 and pattern mask 520 may comprise any suitable material that allows for selective removal (e.g., etching) of the unmasked portion of the poly layer 510. According to some embodiments, masking structures may comprise a photoresist such as Poly(methyl methacrylate) (PMMA), Poly(methyl glutarimide) (PMGI), a Phenol formaldehyde resin, a suitable epoxy, etc.

FIG. 5B depicts a cross section of device 500 after the poly 516 has been removed from the unmasked portion of the first region. According to some embodiments, the removed portion of the poly 516 is removed by any of a number of appropriate etching methods. For instance, the poly layer 516 may be etched using Cl2, KOH, TMAH (tetra-methyl-amino-hydroxyl), or using gas phase etching with, for instance, H2, HCl, O2, H2O (vapor or gas), O3, HF, F2, and Carbon-Fluoride compounds with Cl2 and XeF2. Additionally, according to some embodiments, a combination of etching products may be used.

As depicted in FIG. 5B, the remaining portions of the poly 516 in the first region 504 form memory gates 522a/522b. Additionally, a dielectric 524 has been formed over the memory gates and the charge trapping dielectric 514. According to various embodiments, the dielectric may comprise a single layer dielectric or a multiple layer dielectric such as ONO, described above.

Figure 5C:
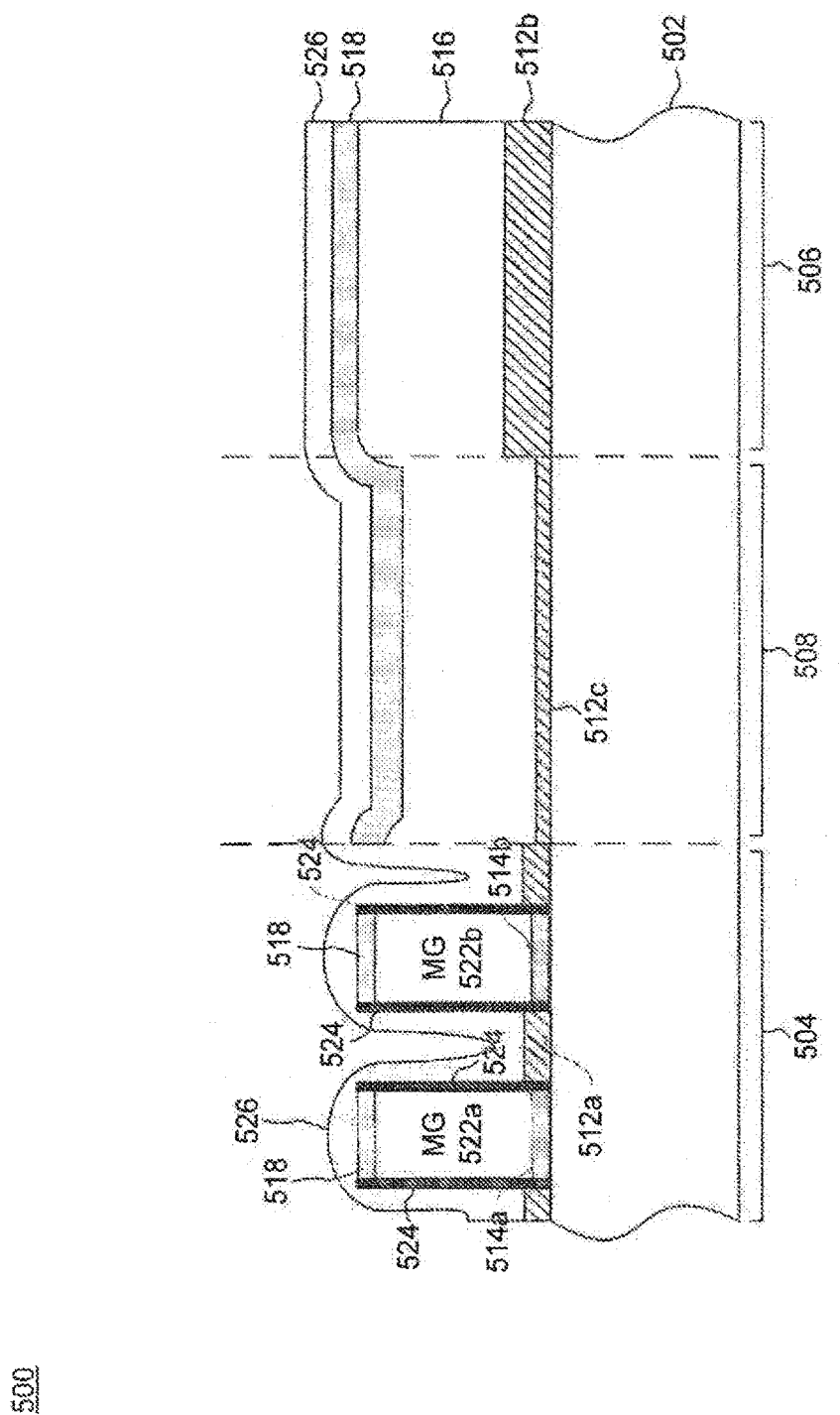

In FIG. 5C, a second poly layer 526 has been formed over the memory gates 522 in the first region 504. According to some embodiments, the second poly layer 526 may be substantially conformal to the other structures formed in the first region 504, but this need not be this case in all embodiments.

Figure 5D:
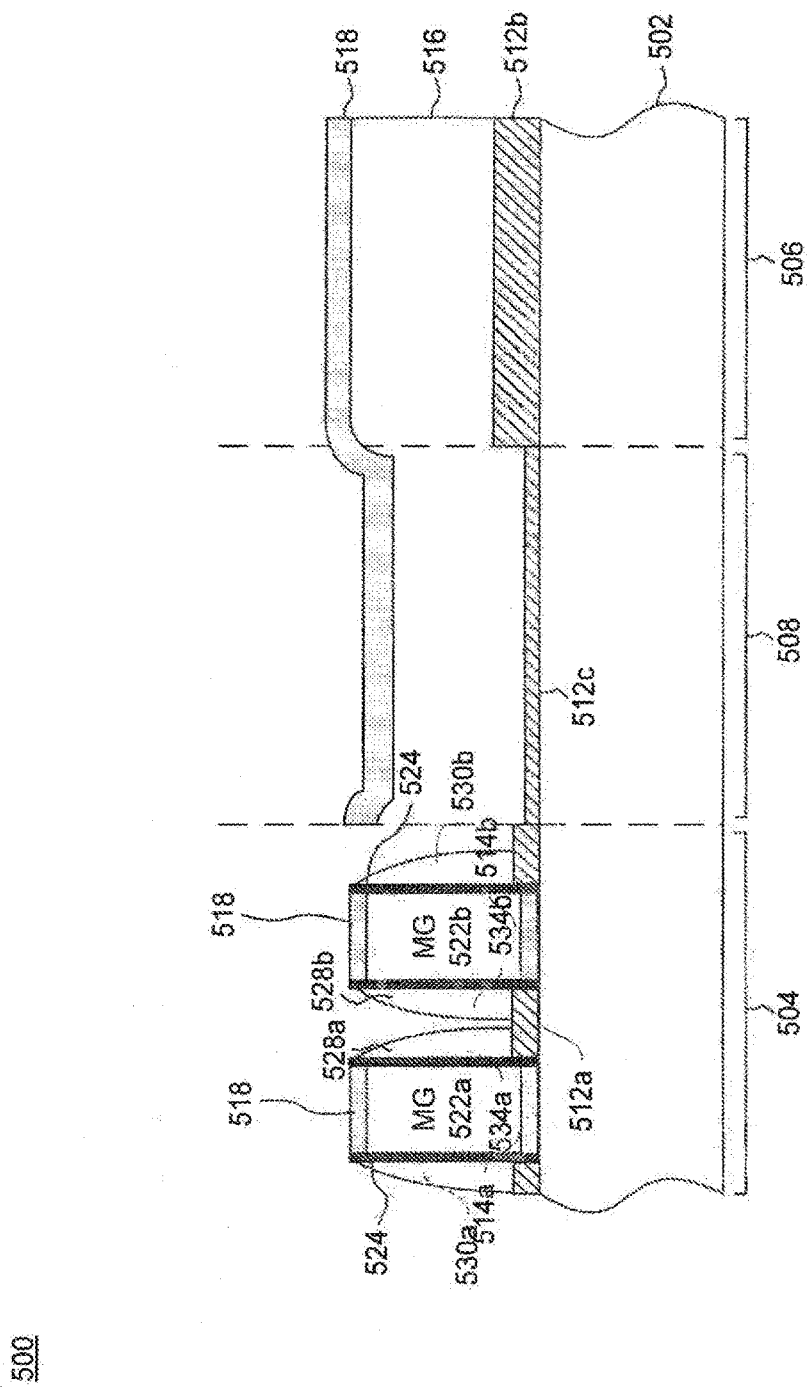
Figure 5E:
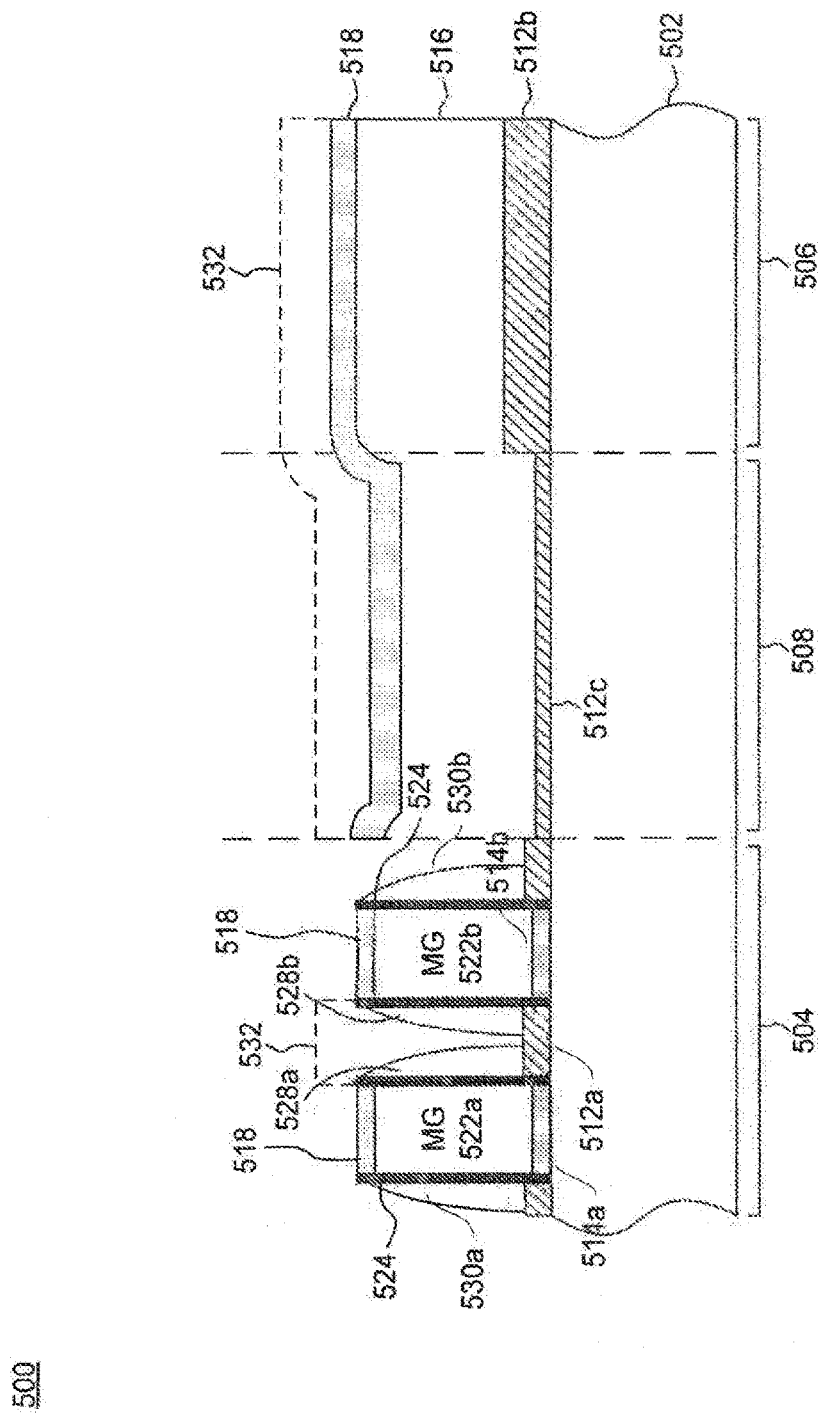
Figure 5F:
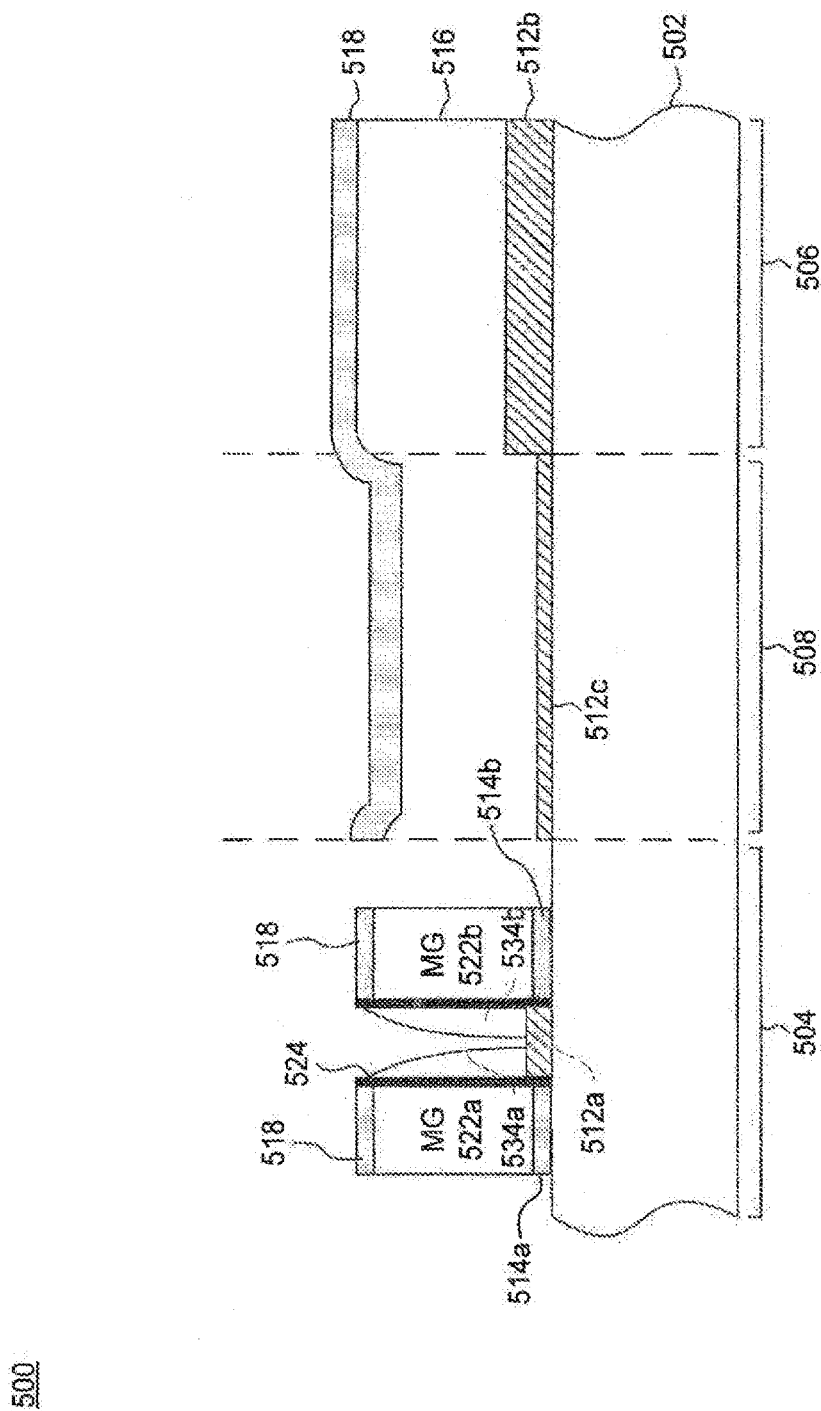

FIG. 5D depicts the partial removal of the second poly layer 526. As can be seen, a portion of the second poly layer 526 remains disposed on the sidewalls of the memory gates 522a and 522b. Poly portions 528a and 528b will eventually comprise the select gates for memory cells to be formed using memory gates 522a and 522b. Portions 530a and 530b, however, are superfluous. Superfluous portions 530a and 530b can be removed by masking portions 528a and 528b with mask 532, as shown in FIG. 5E. Once masked, the superfluous portions 530a and 530b can be removed as well as the unmasked portion of dielectric 524. The result of this removal is depicted in FIG. 5F.

Figure 5G:
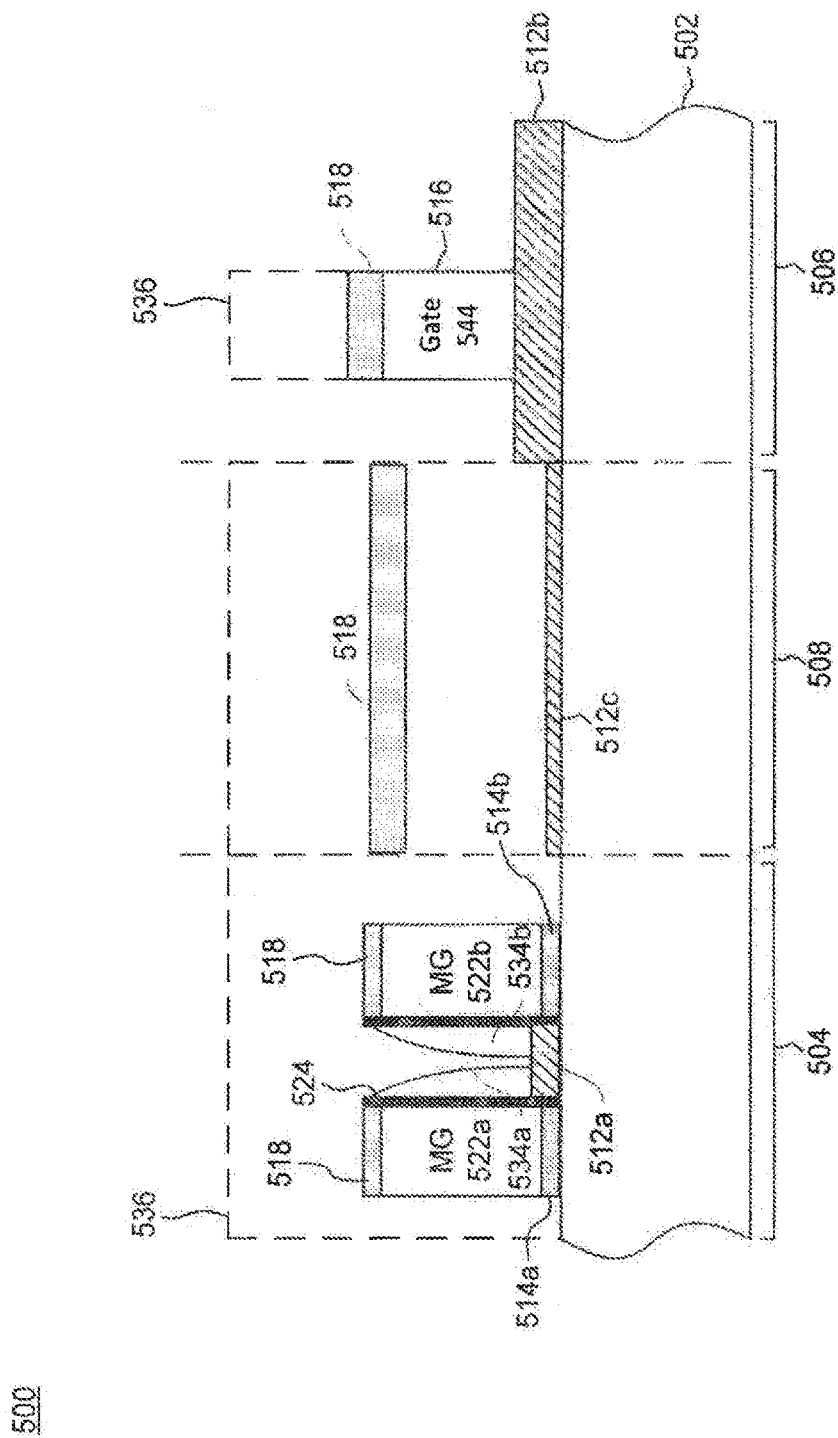

FIG. 5G depicts a cross section of device 500 after several additional steps have been performed according to various embodiments. In FIG. 5G, the first region 504 has been masked with mask 536. Pattern mask 542 has been formed in the second region 506 and pattern mask 540 has been formed in third region 508. According to some embodiments, pattern masks 540 and 542 can be formed from mask 518 by etching. However, mask 518 may also be removed and pattern masks 540 and 542 can be formed separately. After the formation of pattern mask 540, a mask 538 is disposed over the third region 508 in order to protect it from the process steps that occur when forming gates in the second region 506.

FIG. 5H depicts a cross section of device 500 after a logic gate 544 has been defined by the removal of a portion of the second poly 516 from the second region 506. Additionally, a mask 546 has been disposed in the second region 506 in order to protect the gate 544 from the process steps of forming logic gates in the third region 508. Additionally, mask 538 has been removed from the third region 508 in order to facilitate formation of a gate in the third region 508.

Figure 5I:
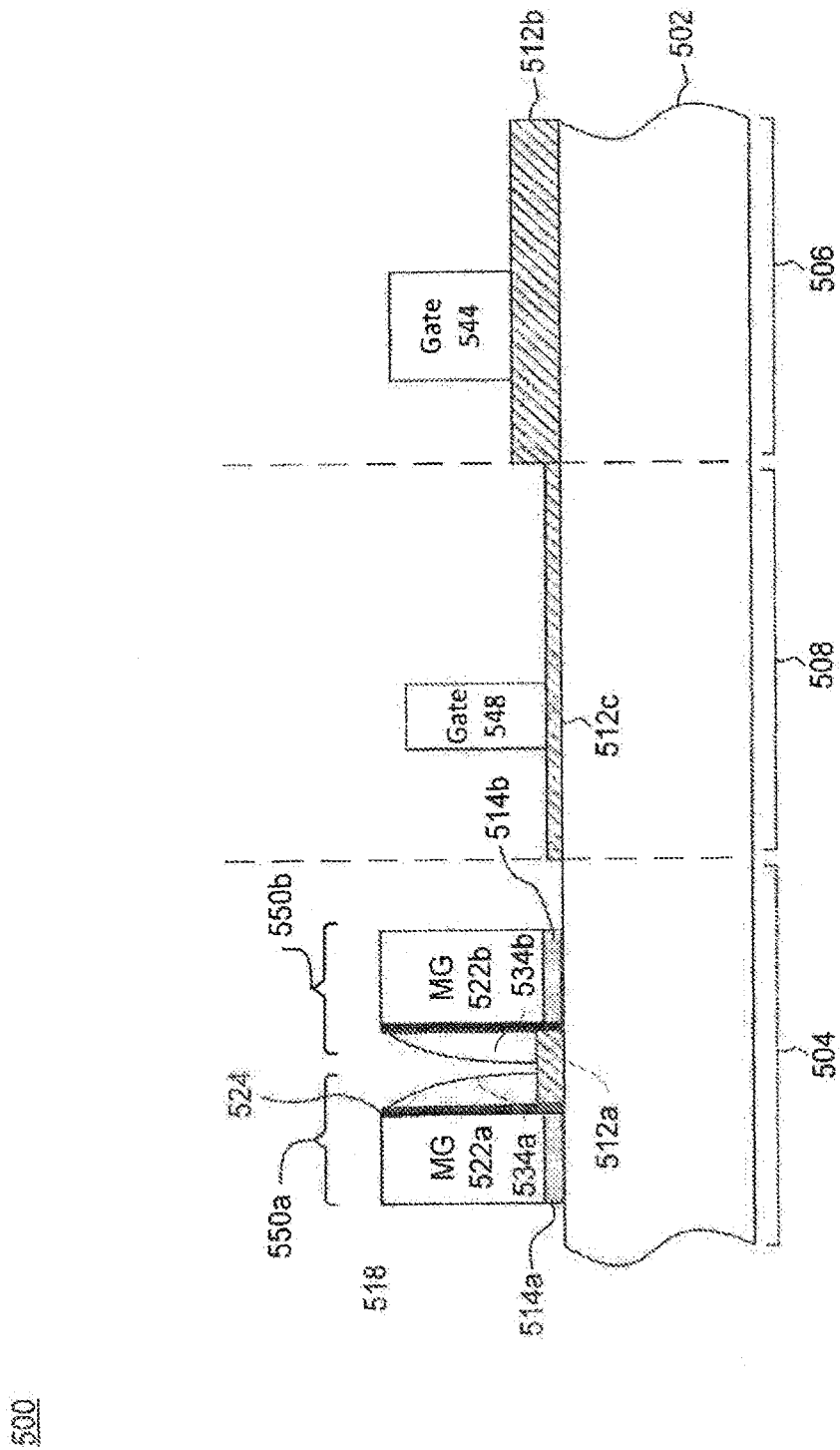

FIG. 5I depicts a cross section of device 500 after a second logic gate 548 has been defined in the third region 508. Additionally, masks 536 and 546 have been removed from the first region 504 and the second region 506, respectively. At this point device 500, thus, comprises a pair of memory cells 550a and 550b disposed in the first region 504 of the device 500. Each of the memory cells 550a and 550b comprises a memory gate 522a and 522b (generally referred to herein as "memory gate 522") and a select gate 534a and 534b, respectively. A dielectric 524a and 524b disposed on a sidewall of the memory gate electrically isolates the select gates 534a and 534b from their associated memory gates 522a and 522b. Charge trapping dielectrics 514a and 514b are disposed beneath the memory gates 522a and 522b. As discussed above, the charge trapping dielectrics 514a and 514b may comprise one or more dielectric layer that includes a charge trapping layer. Additionally, the charge trapping dielectrics 514a and 514b are separate and independently formed form the sidewall dielectrics 524a and 524b.

In addition to the memory cells 550a and 550b, the device 500 comprises a first gate 544 disposed in the second region 506 and a second gate 548 disposed in the third region 508. According to various embodiments, the second region may be configured to accommodate high-voltage circuitry and logic and, accordingly, the gate 544 may be designed to handle high-voltage. For instance, gate 544 may be longer than gate 548 in order to facilitate the use of higher current in the second region 506. Third region 508 may be configured to accommodate relatively lower voltage logic and/or circuitry. Accordingly, gate 548 may be thinner than gate 544 according to various embodiments.

It should be understood, that FIGS. 5A-5I depict a simplified version of device 500 with only a pair of memory cells 550a and 550b and a single logic gate 542 and 540 in each of the second region 506 and the third region 508 for ease of explanation. A person of ordinary skill in the art, however, would understand that device 500 could contain a large number of memory cells, logic cells, and other components in each of the first region 504, second region 506, and third region 508.

Figure 6A:
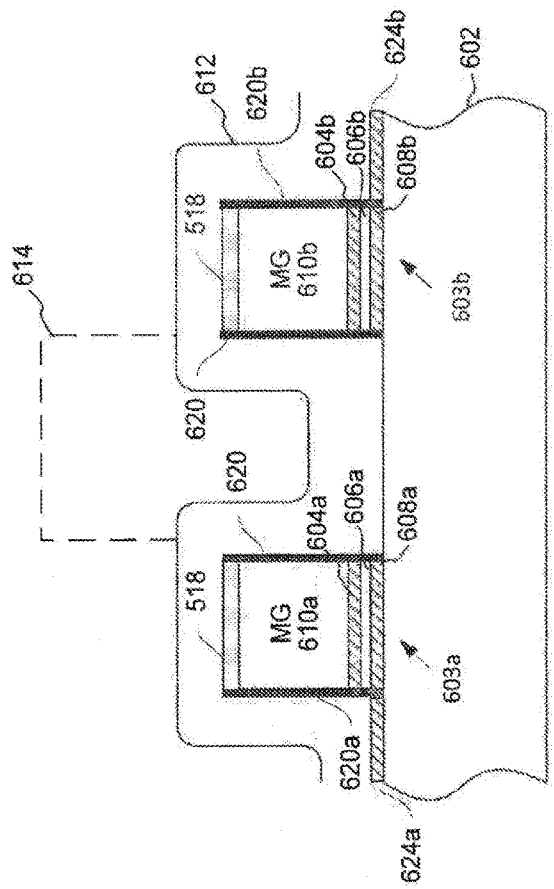
FIGS. 6A-6D depict a cross-section of a memory device at various points during its manufacture according to various embodiments.

FIGS. 6A-6D depict an alternative to the method of forming the select gates 534a and 543b on the sidewalls of the memory gates 522a and 522b depicted in FIGS. 5A-5I. As shown in FIG. 6A, device 600 may comprise a substrate 602 and memory gates 610a and 610b. Disposed between each of the memory gates 610a and 610b is a charge trapping dielectrics 603a and 603b. In this case, the charge trapping dielectrics 603a and 603b each comprise a top oxide 604a and 604b, a nitride layer 606a and 606b, and a bottom oxide 608b. According to some embodiments the bottom oxide 608a and 608b may be in addition to an additional gate oxide (not shown). Additionally, the charge trapping dielectrics may comprise additional layers. For instance, it may be desirable to include multiple nitride layers 606a and 606b to act as charge trapping layers. The oxide layers 604a, 604b, 608a, and 608b may comprise oxides of the substrate or some other material and may be formed according to any of a number of conventional means. The nitride layers 606a and 606b may comprise silicon nitride, silicon rich nitride, or any material suitable to act as a charge trapping layer.

FIG. 6A also depicts a dielectric 620 disposed over the memory gate structures 610a and 610b. Dielectric 620 may comprise a single layer of dielectric or multiple layers such as the ONO described above. Over the dielectric 620, a layer of poly 612 is disposed. Additionally, a mask 614 has been formed over a portion of the poly 612 disposed on the inner sidewalls of the memory gates 610a and 610b.

Figure 6B:
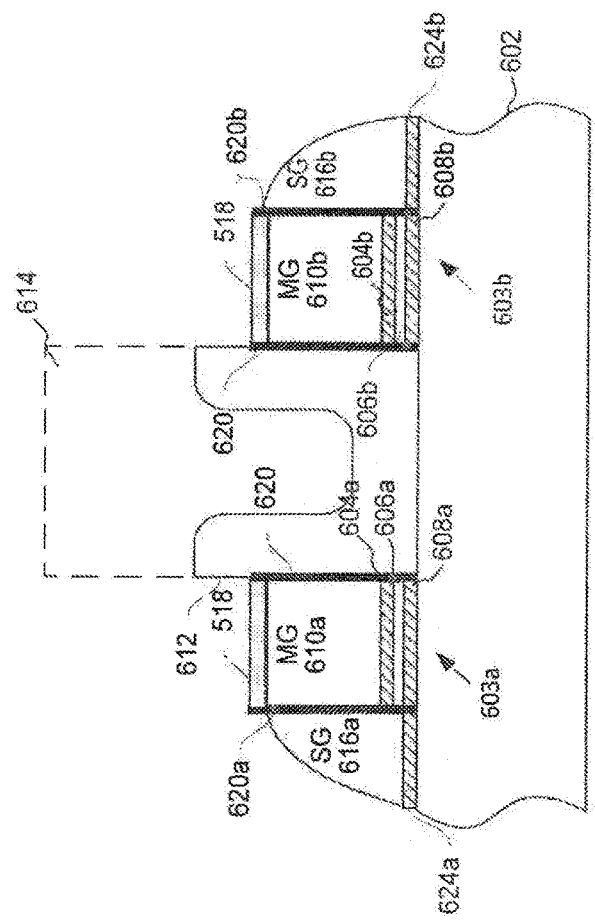

As shown in FIG. 6B, a portion of the poly layer 612 can be removed from the unmasked area of device 600. However, some of the poly in the unmasked portion is purposefully not removed on the outer sidewalls of the memory gates 610a and 610b. The retained portion of the poly 612 on the outer sidewalls of memory gates 610a and 610b will form the select gates 616a and 616b.

Figure 6C:
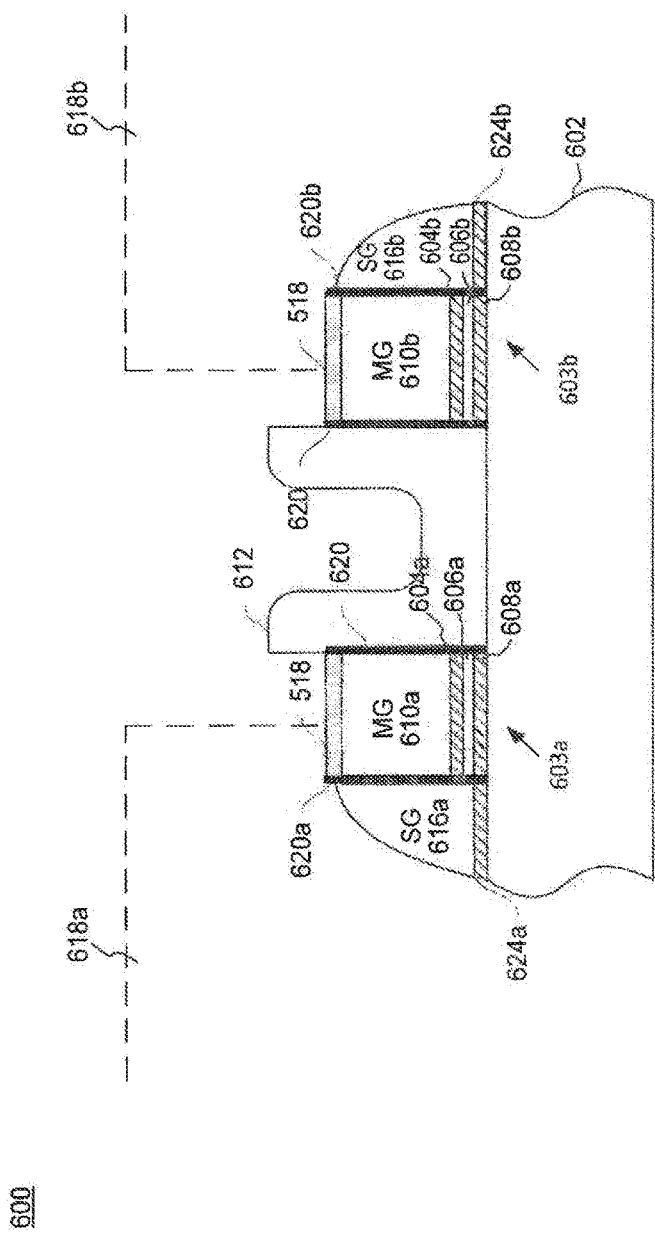

As shown in FIG. 6C, mask 614 is removed leaving poly 612 exposed. Additionally, new masks 618a and 618b have been formed over the select gates 616a and 616b and a portion of memory gates 610a and 610b. The remaining poly 612 can then be removed from the inner sidewall portion of memory gates 610a and 610b, as is shown in FIG. 6D.

Figure 6D:
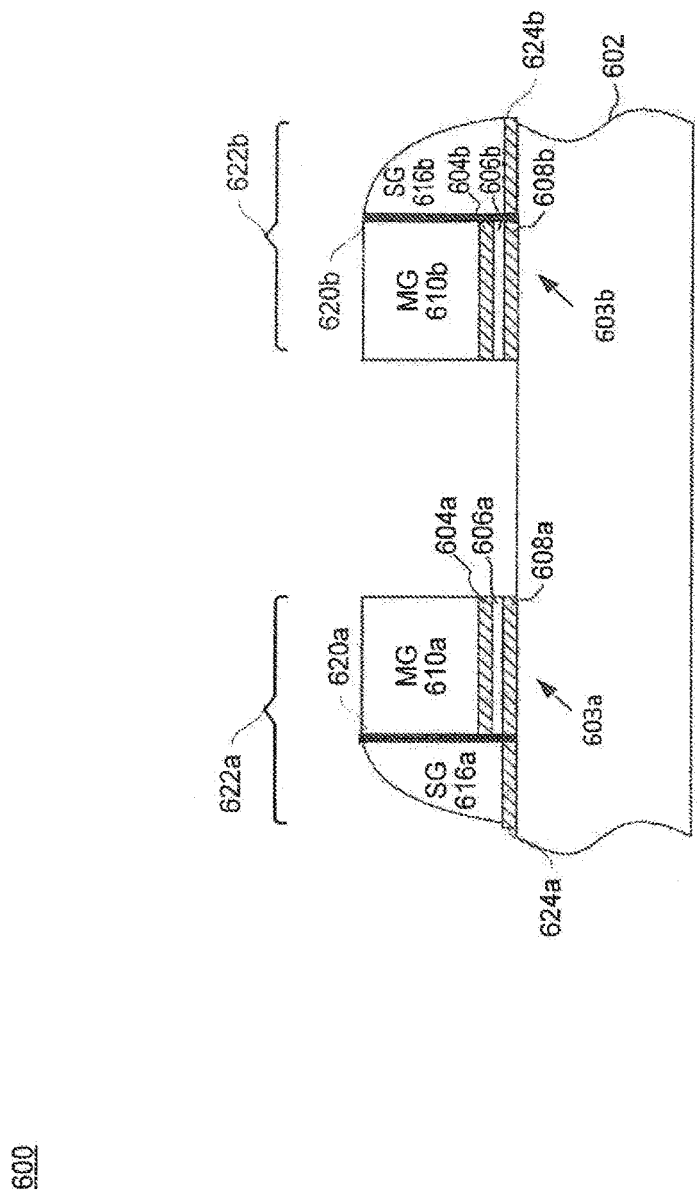

FIG. 6D depicts two split-gate memory cells 622a and 622b formed according to the alternative process depicted in FIGS. 6A-6D. As shown in FIG. 6D, each of the split-gate memory cells includes a memory gate 610a and 610b disposed above a charge trapping dielectric 603a and 603b. The charge trapping dielectric 603a and 603b is itself comprised of several dielectric layers. For instance, the charge trapping dielectric may include a top oxide layer 604a and 604b, a nitride layer 606a and 606b, and a bottom oxide layer 608a and 608b, as shown.

A select gate 616a and 616b has been formed a sidewall of each of the memory gates 610a and 610b. A dielectric 620a and 620b electrically isolates the select gates 616a and 616b from the memory gates 610a and 610b. According to various embodiments, the dielectric 620a and 620b may comprise one or more dielectric layers, but has been formed independently of the charge trapping dielectric 603a and 603b.

For simplicity's sake, FIGS. 5A-5I and 6A-6D do not expressly depict source and drain regions in devices 500 and 600. However, it should be understood that appropriate source and drain regions (e.g., regions 104 and 106) would be formed in devices 500 and 600 during the manufacturing process by any appropriate method such as ion implantation, for example.

Figure 7:
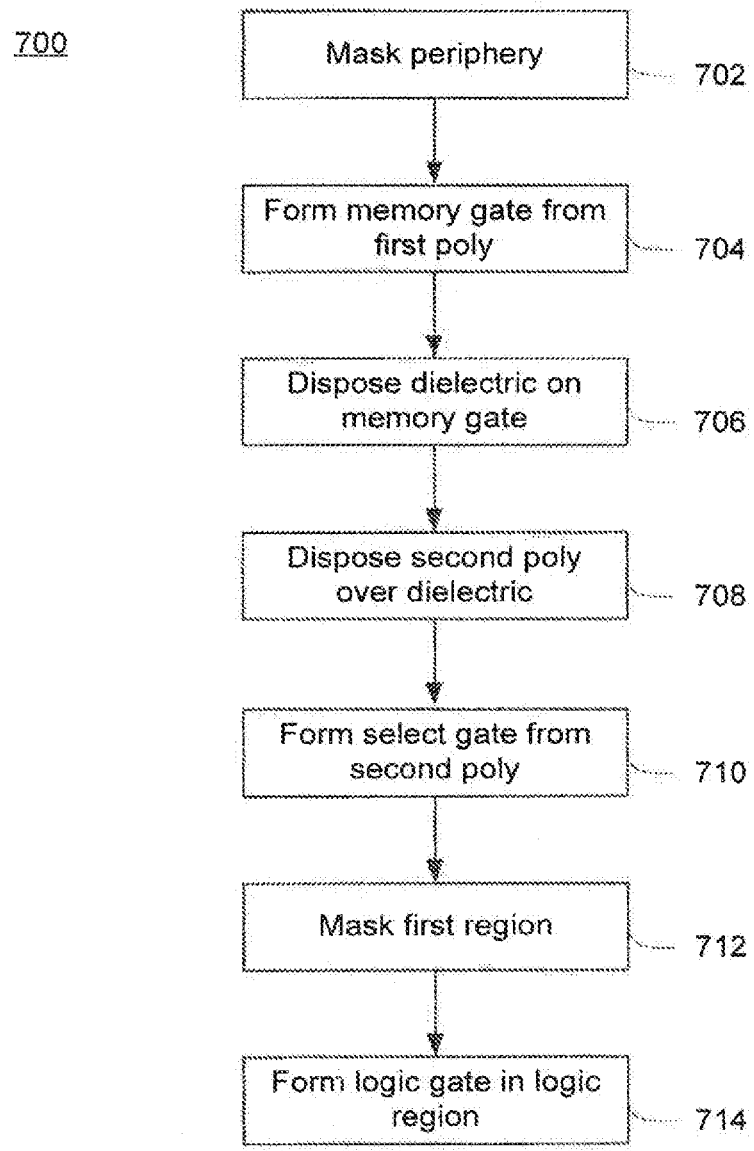
FIG. 7 is a flowchart depicting a method of manufacturing a semiconductor device according to various embodiments.

FIG. 7 is a flowchart depicting a method 700 of forming a semiconductor device according to various embodiments. The discussion of FIG. 7 will make reference to FIGS. 5A-5I, but it should be understood that method 700 is not limited to the specific embodiment depicted in FIGS. 5A-5I, but is more generally applicable.

As shown in FIG. 7, the method 700 may begin by masking a peripheral region of the device 500 at step 702. The peripheral region may include any portion of the device 500 that is not the memory region or first region 504. For instance, in device 500, the peripheral region could include second region 506 and third region 508.

According to various embodiments, step 702 may occur after gate oxides 510a, 510b, and 510c have been formed in each of the first region 505, second region 506, and third region 508. Additionally, prior to performing step 702, a charge trapping dielectric may be formed in the first region 504. As described above, the charge trapping dielectric may comprise one or more layers of dielectric such as ONO, as described above. For instance, the charge trapping dielectric 514 may comprise a first oxide layer 514a, a nitride layer 514b, and a second oxide layer 514c. In addition to the charge trapping layer, a first poly layer 516 may be formed in each of the first region 504, the second region 506, and the third region 508 prior to performing step 702.

At step 704, a memory gate 522 can be formed from a first poly 516. This can be accomplished by masking a portion of the poly 516 in the first region 504 and etching the unmasked poly 516 to define a memory gate 522.

At step 706, a dielectric 524 is disposed over memory gate 522. The dielectric 524 may comprise one or more dielectric layers. For instance, the dielectric 524 may include a nitride layer sandwiched between two oxide layers.

At step 708, a second poly layer 526 is disposed over the dielectric 524. According to some embodiments, the second poly layer 526 may be substantially conformal to the other structures formed in the first region, but this need not be this case in all embodiments.

At step 710, a select gate 534 is formed from the second poly 526. According to some embodiments. The select gate 534 can be formed by removing poly from the first region 504, while retaining a portion of the second poly layer 526 remains disposed on the sidewalls of the memory gate 522. A superfluous portion 530 of the poly 526 can be removed form one of the sidewalls of the memory gate by masking a select gate portion 534 and etching the rest. At step 712, the first region, which now contains a largely completed memory cell, can be masked to allow the formation of a logic gate in the second region 506 at step 714.

Figure 8:
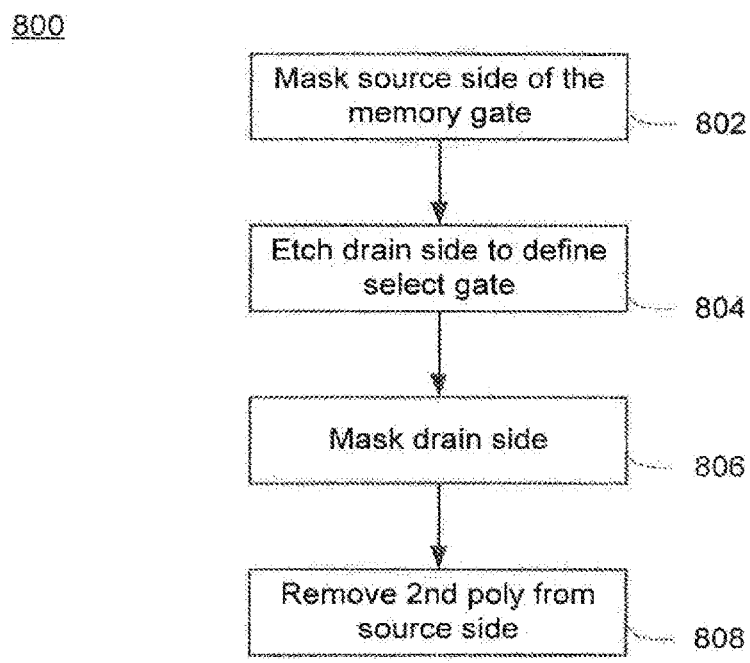
FIG. 8 is a flowchart depicting a method of manufacturing a semiconductor device according to various embodiments.

FIG. 8 is a flowchart depicting a method 800 of forming a select gate according to various embodiments. The discussion of FIG. 8 will make reference to FIGS. 6A-6D, but it should be understood that method 800 is not limited to the specific embodiment depicted in FIGS. 6A-6D, but is more generally applicable.

According to method 800, a source side of memory gate 610 is masked at step 802. Prior to performing step 802, however, a device 600 may be formed. Device 600 may comprise a substrate 602 and memory gates 610a and 610b (referred to in general as "memory gate 610" herein). Disposed between each of the memory gate 610 and the substrate is a charge trapping dielectric 603. The charge trapping dielectrics 603 may include a top oxide 604, a nitride layer 606, and a bottom oxide 608. According to some embodiments the bottom oxide 608 may be in addition to an additional gate oxide. Additionally, the charge trapping dielectric 603 may comprise additional layers. For instance, it may be desirable to include multiple nitride layers 606 to act as charge trapping layers. The oxide layers 604 and 608 may comprise oxides of the substrate or some other material and may be formed according to any of a number of conventional means. The nitride layer 606 may comprise silicon nitride, silicon rich nitride, or any material suitable to act as a charge trapping layer.

A dielectric 620 may also have been disposed over the memory gate structure 610 prior to step 802. Dielectric 620 may comprise a single layer of dielectric or multiple layers such as the ONO described above. Over the dielectric 620, a layer of poly 612 is disposed. Additionally, a poly layer 612 may be disposed over the memory gate structure 610 prior to performing step 802.

At step 804, a drain (unmasked in this case) is removed (e.g., etched) to define a select gate 616 on the sidewall of the memory gate 610. The select gate 616 can be defined by removing a portion of the poly 612 from the unmasked region. However, some of the poly 612 is purposefully left on the sidewall of the memory gate 610 in order to form the select gate 616.

At step 806, the drain side of the memory gate can be masked to protect the select gate 616. Next, the remaining poly 612 can be removed from the source side of the memory gate at step 808.

Figure 9:
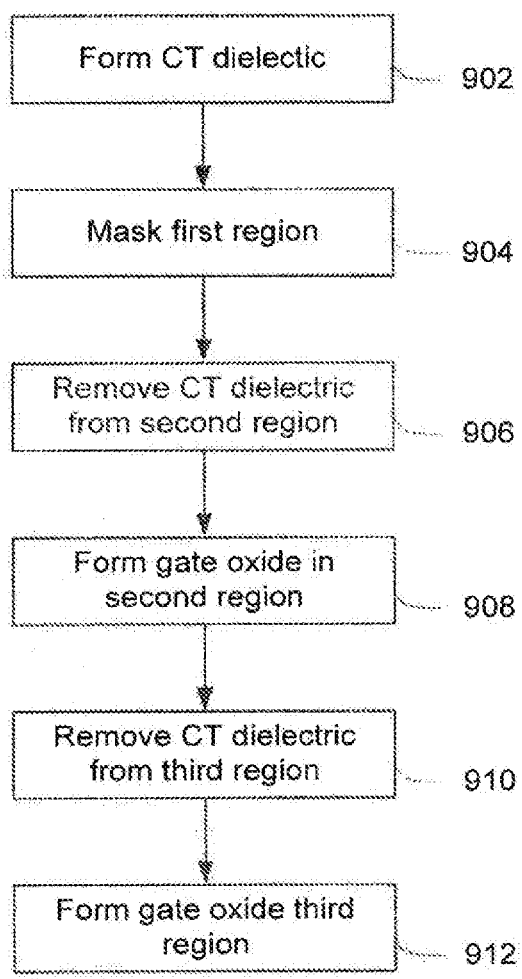
FIG. 9 is a flowchart depicting a method of manufacturing a semiconductor device according to various embodiments.

FIG. 9 is a flowchart depicting a method 900 for forming a charge trapping dielectric in a first region 504 of a semiconductor device 500 according to various embodiments. The device 500 may include a first region 504, a second region 506, and a third region 508 as depicted, for instance, in FIGS. 5A-5I.

At step 902, the charge trapping dielectric 514 is formed in each of the first region 504, the second region 506, and the third region 508. The charge trapping dielectric may include one or more dielectric layers according to various embodiments. For instance, according to some embodiments, the charge trapping dielectric may include a top oxide 514a, a nitride layer 514b, and a bottom oxide 514c. Additionally, the step of forming the charge trapping dielectric may comprise depositing each of the top oxide 514a, the nitride layer 514b, and the bottom oxide 514c separately.

At step 904, the first region 504 is masked to protect it from process steps that will be carried out in the second region 506 and the third region 508. At step 906, the charge trapping dielectric 514 is removed from the second region and a gate oxide 510b can be formed at step 908.

At step 910, the charge trapping dielectric 514 can be removed from the third region and a gate oxide 514c can be formed in the third region at step 912. After step 912, the device 500 includes a charge trapping dielectric in the first region separately formed gate oxides 510b and 510c in the second region 506 and the third region 508.

Figure 10:
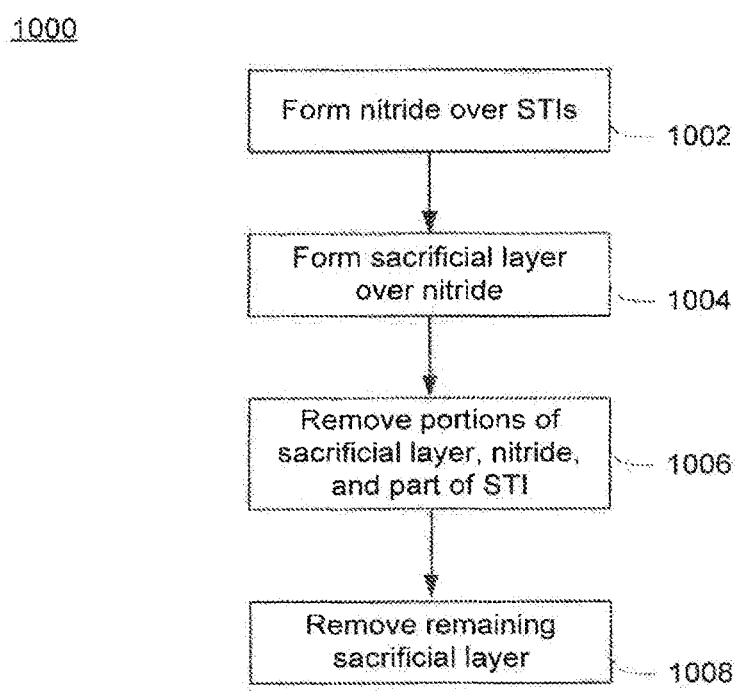
FIG. 10 is a flowchart depicting a method of manufacturing a semiconductor device according to various embodiments.

As noted above, according to some embodiments, silicon rich nitride (SiRN) can be used for the charge trapping layer 514b. SiRN can be advantageous to use as the charge trapping layer in a split-gate memory cell because it has been found to have better reliability, a faster erase speed, and a lower erase current. While SiRN has some properties that make it good to use as the charge trapping layer 514b, it also has some properties that make it difficult to use. For instance, unlike other nitrides, SiRN is slightly conductive. Accordingly, it is important to ensure that the charge trapping layer 514b of each memory cell (e.g., 550a or 550b) is isolated from the other memory cells in order to avoid leakage. FIG. 10 is a flowchart depicting a method 1000 of isolating the charge trapping layers in each of the memory cells from each other according to various embodiments. FIGS. 11A-11E depict a semiconductor device 1100 at various points during method 1000. Accordingly, FIG. 10 will be discussed in conjunction with FIGS. 11A-11E.

Figure 11A:
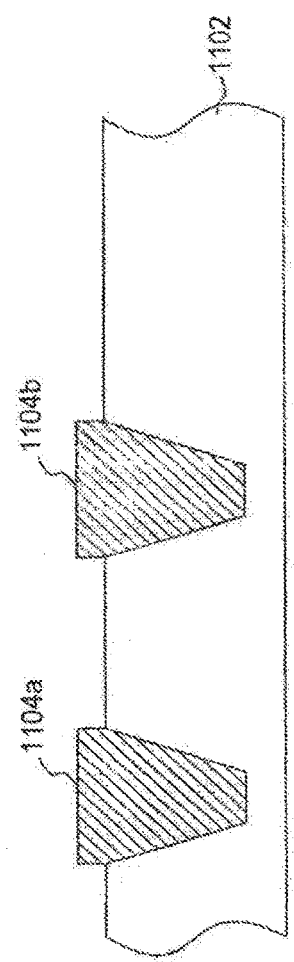
FIGS. 11A-11E depict a cross-section of a memory device at various points during its manufacture according to various embodiments.

FIG. 11A depicts a semiconductor device 1100. The device 1100 includes a substrate 1102 and shallow trench isolation (STI) regions 1104a and 1104b (collectively referred to herein as STI regions 1104). STI regions 1104 function to electrically isolate adjacent semiconductor components (not shown) from each other.

Figure 11B:
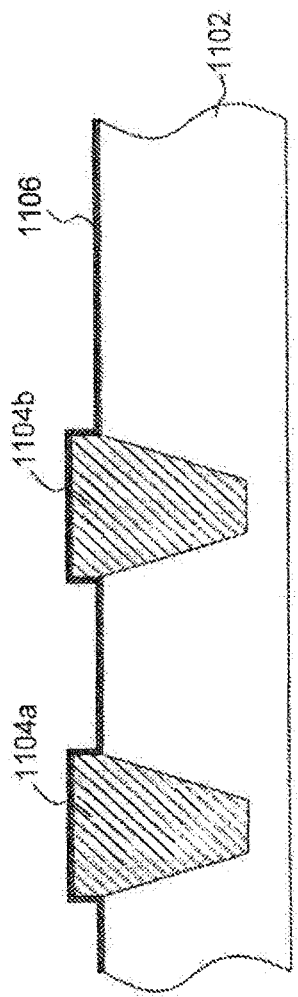
Figure 11C:
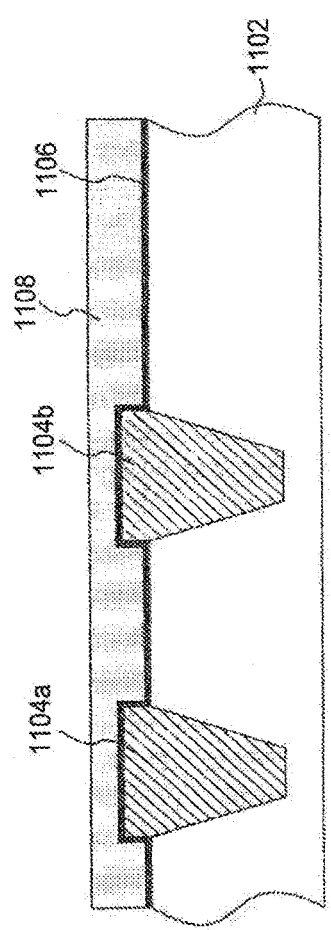

According to method 1000, at step 1002, a nitride layer 1106 is formed over the STI regions 1104 of the semiconductor device 1100. The result of this step is depicted in FIG. 11B. The nitride layer 1106 may comprise SiRN or any other suitable nitride. As shown in FIG. 11B, the nitride layer 1106 is conformal with the top of semiconductor device 1100.

At step 1004, a sacrificial layer 1108 may be formed over the nitride layer 1106. The sacrificial layer 1108 may comprise any suitable material. For instance, according to some various embodiments, the sacrificial layer 1108 may comprise an oxide, BARC, photoresist, etc. The device 1100 is depicted after step 1004 in FIG. 11C.

Figure 11D:
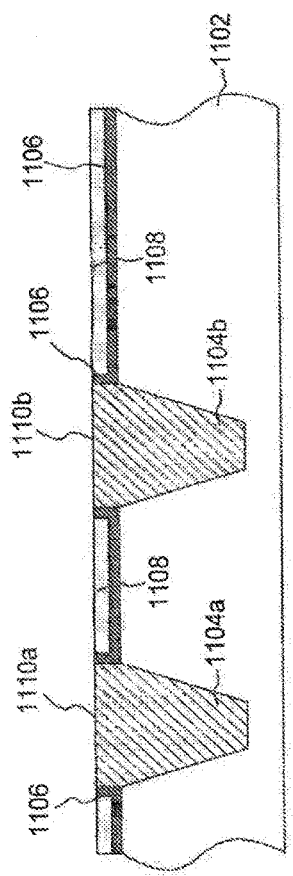
Figure 11E:
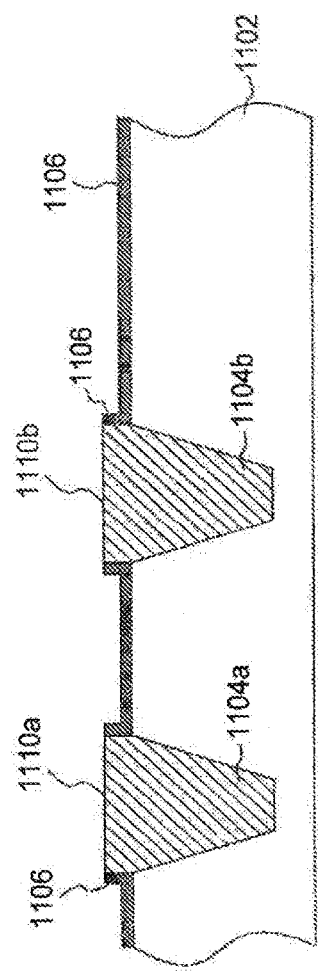

At step 1006, portions of the sacrificial layer 1108, the nitride layer 1106, and the STI regions 1104 can be removed. As shown in FIG. 11D, the removed portions of the sacrificial layer 1108, the nitride layer 1106, and the STI regions 1104 cause a discontinuity in the nitride layer 1106. According to various embodiments, the removed portions 1108, 1106, and 1104 can be removed by dry or wet etch, polish back, or any other appropriate means. At step 1008, the remaining portion of the sacrificial layer 1108 can be removed from the device 1100, as depicted in FIG. 11E.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A memory device, comprising:
   a substrate;
   a first charge trapping structure formed on the substrate;
   a first memory gate formed on the first charge trapping structure;
   a first dielectric formed on a sidewall of the first memory gate;
   a second dielectric formed on the substrate; and
   a first select gate formed on the second dielectric such that the first select gate and the first dielectric are formed on the sidewall of the first memory gate,
   wherein the first dielectric is between:
      the first memory gate and the first select gate, and
      the first charge trapping structure and the second dielectric; and
   wherein the first dielectric is comprised of a plurality of dielectric layers, wherein at least one dielectric layer, of the plurality of dielectric layers is separated from the first charge trapping structure by at least one other dielectric layer of the plurality of dielectric layers.

2. The memory device of claim 1, wherein the at least one dielectric layer comprises a nitride layer.

3. The memory device of claim 1, wherein the first charge trapping structure comprises a first layer of material including a nitride.

4. The memory device of claim 3, wherein the first charge trapping structure comprises a second layer of material and a third layer of material including one or more oxides, wherein the first layer of material is between the second layer of material and the third layer of material.

5. The memory device of claim 1, wherein at least a portion of the second dielectric is between the select gate and the memory gate.

6. The memory device of claim 1, further comprising:
   a second charge trapping structure formed on the substrate;
   a second memory gate formed on the second charge trapping structure;
   a third dielectric formed on a sidewall of the second memory gate; and
   a second select gate formed on the second dielectric,
   wherein the third dielectric is between:
      the second memory gate and the second select gate, and
      the second charge trapping structure and the second dielectric.

7. The memory device of claim 6, wherein the first select gate is formed on the first dielectric and the second select gate is formed on the third dielectric.

8. The memory device of claim 6, wherein the second dielectric is between the first dielectric and the third dielectric.

9. The memory device of claim 6, wherein the first select gate is between the second select gate and the first dielectric.

10. The memory device of claim 6, wherein the second select gate is between the first select gate and the third dielectric.

11. A semiconductor device, comprising:
    a substrate comprising a source region and a drain region;
    a bit storing element formed on the substrate;
    a memory gate structure;
    a first insulating layer formed on the substrate;
    a second insulating layer formed on the substrate; and
    a select gate structure formed on the first insulating layer such that the select gate structure and the second insulating layer are formed on a sidewall of the memory gate structure,
    wherein the second insulating layer is formed on the memory gate structure and the select gate structure and between the memory gate structure and the select gate structure, and wherein the second insulating layer comprises a plurality of insulating layers, wherein one insulating layer of the plurality of insulating layers is separated from the bit storing element by another insulating layer of the plurality of insulating layers.

12. The semiconductor device of claim 11, wherein the second insulating layer is formed on the sidewall of the memory gate structure and the memory gate structure is formed above the bit storing element.

13. The semiconductor device of claim 11, wherein at least a portion of the first insulating layer was formed on the substrate at a same time as at least a portion of the second insulating layer was formed on the substrate.

14. The semiconductor device of claim 11, wherein the first insulating layer and the second insulating layer form a continuous shape.

* * * * *